(12) United States Patent  
Tsai

(10) Patent No.: US 8,730,138 B2  
(45) Date of Patent: May 20, 2014

(54) ORGANIC LIGHT EMITTING DIODE PIXEL ARRAY

(75) Inventor: Tsung-Ting Tsai, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 449 days.

(21) Appl. No.: 13/038,391

(22) Filed: Mar. 2, 2011

(65) Prior Publication Data

US 2012/0139819 A1 Jun. 7, 2012

(30) Foreign Application Priority Data

Dec. 3, 2010 (TW) ................................ 99142179 A

(51) Int. Cl.
*G09G 3/30* (2006.01)

(52) U.S. Cl.
USPC ............................. 345/80; 345/76; 315/169.3

(58) Field of Classification Search
USPC .................................... 345/76–80; 315/169.3
See application file for complete search history.

(56) References Cited

U.S. PATENT DOCUMENTS

| | | | | |
|---|---|---|---|---|
| 6,040,810 | A * | 3/2000 | Nishimura | 345/87 |
| 6,642,651 | B2 * | 11/2003 | Yudasaka | 313/504 |
| 6,734,839 | B2 * | 5/2004 | Yudasaka | 345/90 |
| 6,885,148 | B2 * | 4/2005 | Yudasaka | 313/504 |
| 7,609,310 | B2 * | 10/2009 | Miyagawa | 348/302 |
| 2005/0052371 | A1 * | 3/2005 | Ozawa | 345/76 |
| 2008/0158209 | A1 * | 7/2008 | Ozawa | 345/204 |
| 2009/0128461 | A1 * | 5/2009 | Geldard et al. | 345/84 |
| 2011/0012816 | A1 * | 1/2011 | Kang et al. | 345/76 |
| 2011/0148944 | A1 | 6/2011 | Kobayashi | |
| 2011/0163318 | A1 * | 7/2011 | Park et al. | 257/59 |
| 2011/0186866 | A1 * | 8/2011 | Farquhar et al. | 257/88 |
| 2011/0221661 | A1 | 9/2011 | Yoon et al. | |
| 2012/0133687 | A1 * | 5/2012 | Hirakata et al. | 345/690 |

FOREIGN PATENT DOCUMENTS

| | | |
|---|---|---|
| CN | 101893791 | 11/2010 |
| CN | 102194853 | 9/2011 |
| TW | 201133822 | 10/2011 |

OTHER PUBLICATIONS

"Second Office Action of China Counterpart Application", issued on Mar. 14, 2013, p. 1-p. 4, in which the listed reference was cited.
"Distinguished Paper: LTPS-based Transparent AM OLED" by Song et al. of Samsung Mobile Display Co., Ltd., Korea; SID 10 Digest, 2010, pp. 144-147.
"Office Action of China Counterpart Application", issued on Aug. 6, 2013, p. 1-p. 4, in which the listed foreign reference was cited.
"Office Action of Taiwan Counterpart Application", issued on Jan. 21, 2014, pp. 1-5.

* cited by examiner

*Primary Examiner* — Dmitriy Bolotin
(74) *Attorney, Agent, or Firm* — Jianq Chyun IP Office

(57) ABSTRACT

An organic light emitting diode (OLED) pixel array includes a plurality of first signal lines, a plurality of second signal lines, and a plurality of pixel array units. The pixel array units are arranged in array on a substrate. Each of the pixel array units includes a plurality of OLED pixels. The OLED pixels are connected to the same first signal line and respectively connected to a first portion and a second portion of the second signal lines. At least two of the OLED pixels are located between the first portion and the second portion. A transmittance region is surrounded by the first portion, the second portion, and the OLED pixels, and the first portion and the second portion are respectively located at two opposite sides of the transmittance region.

9 Claims, 5 Drawing Sheets

ORGANIC LIGHT EMITTING DIODE PIXEL ARRAY

CROSS-REFERENCE TO RELATED APPLICATION

This application claims the priority benefit of Taiwan application serial no. 99142179, filed on Dec. 3, 2010. The entirety of the above-mentioned patent application is hereby incorporated by reference herein and made a part of this specification.

BACKGROUND OF THE INVENTION

1. Field of the Invention

The invention relates to an organic light emitting diode (OLED) pixel array. More particularly, the invention relates to an OLED pixel array having transmittance regions.

2. Description of Related Art

An OLED display is characterized by self-luminance, wide view angle, fast response speed, low operation voltage, low temperature operation, high photo-voltaic efficiency, and so on. Therefore, the OLED display is likely to become a mainstream of the next generation display. Among various OLED displays, a transparent OLED display attracts most attention. The transparent OLED display can be placed in front of another display, and therefore a user is able to observe images (i.e., external images) displayed by another display through the transparent OLED display.

Generally, in a conventional transparent OLED display, a transmittance region is located between every two sub-pixels. Patterns are formed by the transmittance regions that have small area and are arranged in line with the arrangement of the sub-pixels, and thus the spatial frequency of the transmittance regions is excessively high. As a result, the arrangement of the transmittance regions results in unfavorable imaging quality (e.g., image definition) of the external images observed through the transparent OLED display. Based on the above, how to develop a transparent OLED display to improve the imaging quality of the external images observed through the transparent OLED display is one of the issues to be resolved by researchers.

SUMMARY OF THE INVENTION

The invention is directed to an OLED pixel array. External images observed through the OLED pixel array can have satisfactory image definition.

The invention provides an OLED pixel array configured on a substrate. The OLED pixel array includes a plurality of first signal lines, a plurality of second signal lines, and a plurality of pixel array units. The second signal lines intersect the first signal lines. Here, when the first signal lines are scan lines, the second signal lines are data lines, and when the first signal lines are the data lines, the second signal lines are the scan lines. The pixel array units are arranged in array on the substrate, and each of the pixel array units includes a plurality of OLED pixels. The OLED pixels are connected to the same first signal line and are respectively connected to a first portion and a second portion of the second signal lines. At least two of the OLED pixels are located between the first portion and the second portion. A transmittance region is surrounded by the first portion, the second portion, and the OLED pixels, and the first portion and the second portion are respectively located in two opposite sides of the transmittance region.

In view of the above, the first portion and the second portion of the second signal lines are arranged at two opposite sides of the pixel array units in the OLED pixel array of the invention, such that the area of each transmittance region is expanded, and a width of each transmittance region is at least greater than a width of one pixel. Thereby, the spatial frequency of the transmittance regions is reduced, and the external images observed through the OLED pixel array can have the improved image definition.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

First Embodiment

Figure 1:
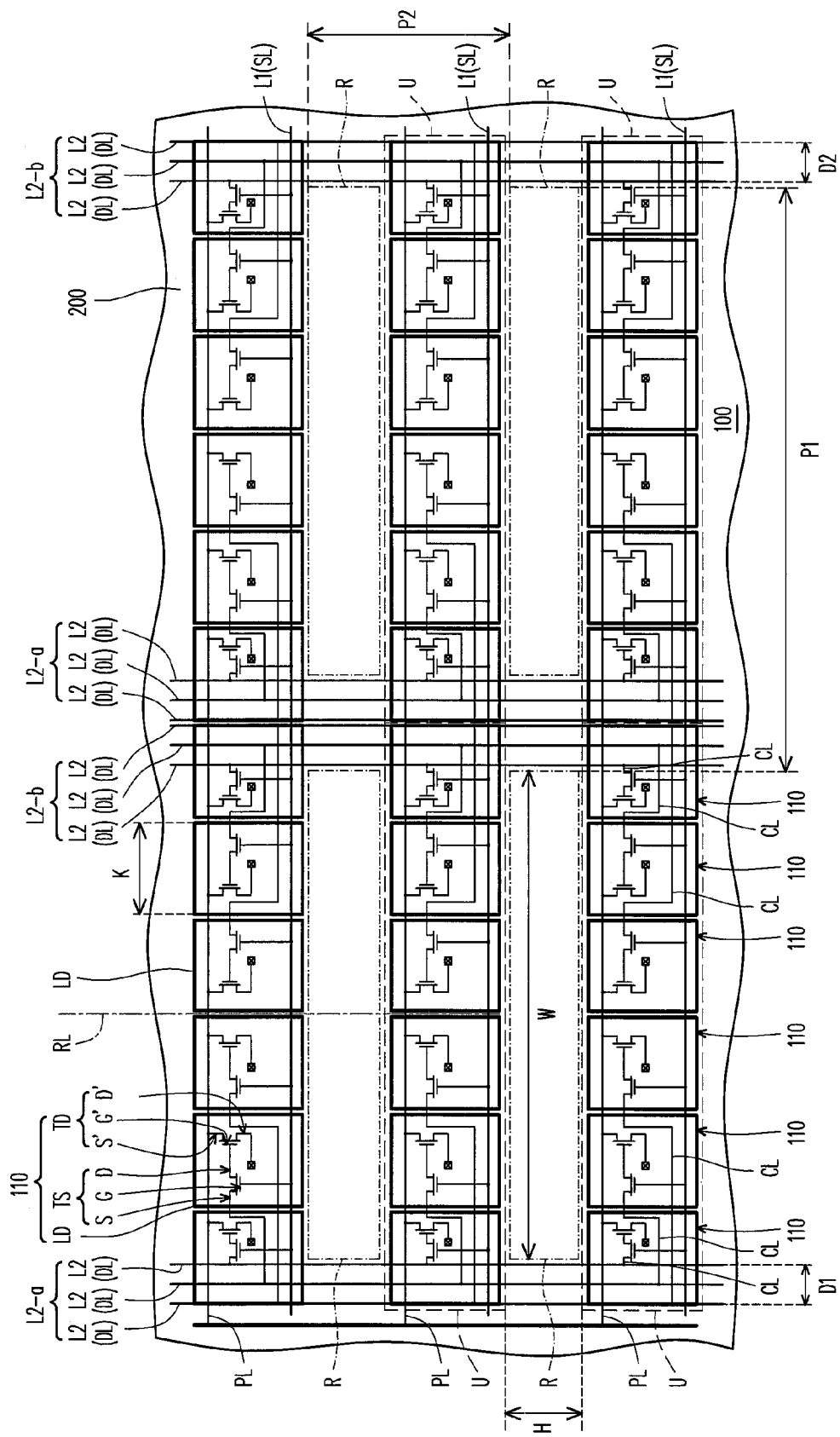
FIG. 1 is a schematic view illustrating an OLED pixel array according to a first embodiment of the invention.

FIG. 1 is a schematic view illustrating an OLED pixel array 100 according to a first embodiment of the invention. With reference to FIG. 1, the OLED pixel array 100 of this embodiment is configured on a substrate 200 and includes a plurality of first signal lines L1, a plurality of second signal lines L2, and a plurality of pixel array units U. The substrate 200 of this embodiment carries devices thereon, and the substrate 200 can be made of glass, quartz, organic polymer, or any other appropriate material.

The first signal lines L1 intersect the second signal lines L2. Here, when the first signal lines L1 are scan lines SL, the second signal lines L2 are data lines DL, and when the first signal lines L1 are the data lines DL, the second signal lines L2 are the scan lines SL. According to this embodiment, the first signal lines L1 are the scan lines SL, and the second signal lines L2 are the data lines DL. Here, the first signal lines L1 (i.e., the scan lines SL) intersect the second signal lines L2 (i.e., the data lines DL). That is to say, an extension direction of the first signal lines L1 (i.e., the scan lines SL) is not parallel to or is substantially perpendicular to an extension direction of the second signal lines L2 (i.e., the data lines DL).

Besides, the first signal lines L1 (i.e., the scan lines SL) and the second signal lines L2 (i.e., the data lines DL) are in different film layers. In consideration of conductivity, the first signal lines L1 (i.e., the scan lines SL) and the second signal lines L2 (i.e., the data lines DL) are normally made of metal materials. However, the invention is not limited thereto. In other words, the first signal lines L1 (i.e., the scan lines SL) and the second signal lines L2 (i.e., the data lines DL) can also be made of other conductive materials in addition to the metal materials, such as an alloy, a metal nitride material, a metal oxide material, a metal oxynitride material, or a stacked layer containing the metal materials and other conductive materials.

Particularly, the OLED pixel array 100 of this embodiment can further include a plurality of power lines PL. The power lines PL are, for instance, parallel to the first signal lines L1 and electrically connected to the pixel array units U for power supply. In this embodiment, the power lines PL can be electrically connected to one another, and the power lines PL and the first signal lines L1 are in the same film layer. However, the invention is not limited thereto. According to other embodiments of the invention, the power lines PL are not parallel to the first signal lines L1 but parallel to the second signal lines L2, for instance, and the power lines PL and the second signal lines L2 can be selectively in the same film layer.

The pixel array units U are arranged in array on the substrate 200, and each of the pixel array units U includes a plurality of OLED pixels 110 connected to the power lines PL. The OLED pixels 110 in each of the pixel array units U are connected to the same first signal line L1, and the OLED pixels 110 are connected to a first portion L2-$a$ and a second portion L2-$b$ of the second signal lines L2. Herein, the first portion L2-$a$ and the second portion L2-$b$ respectively include at least one second signal line L2 and are connected to the corresponding OLED pixels 110. Additionally, each of the pixel array units U can further include a plurality of connection lines CL correspondingly connecting the OLED pixels 110 to the first portion L2-$a$ and the second portion L2-$b$.

Note that a transmittance region R is surrounded by the first portion L2-$a$, the second portion L2-$b$, and the pixel array units U, and the first portion L2-$a$ and the second portion L2-$b$ are respectively located at two opposite sides of the transmittance region R. That is to say, each of the pixel array units U is not closely arranged. The adjacent two pixel array units U have a distance H therebetween in the extension direction of the second signal lines L2 (i.e., the data lines DL), so as to form the transmittance region R. In the OLED pixel array 100 of this embodiment, the distance H needs not have a fixed value, and the distance H between the pixel array units U in different rows can be appropriately adjusted based on actual requirements.

According to an embodiment of the invention, at least two of the OLED pixels 110 are located between the first portion L2-$a$ and the second portion L2-$b$. Hence, the transmittance region R has a width W in the extension direction of the first signal lines L1 (i.e., the scan lines SL), and the width W is at least greater than a width of one of the OLED pixels 110 in the same extension direction. Thereby, the spatial frequency of the transmittance regions R in the entire OLED pixel array 100 can be significantly reduced. When the transparent OLED display formed by the OLED pixel array 100 is placed in front of another display, the external images observed through the OLED pixel array 100 can have satisfactory imaging quality.

It should be mentioned that the display quality of the OLED display having the OLED pixel array 100 may be reduced, e.g., images are not continuously displayed, given that a pitch P1 between the transmittance regions R in the extension direction of the first signal lines L1 (i.e., the scan lines SL) and a pitch P2 between the transmittance regions R in the extension direction of the second signal lines L2 (i.e., the data lines DL) are excessively large. Thus, the pitch P1 and the pitch P2 should be adjusted based on actual requirements. The pitch P1 and the pitch P2 between the transmittance regions R can be approximately 300 um, respectively.

Note that the pitch P1 and the pitch P2 can certainly be the same or different from each other. On the other hand, a width D1 occupied by the first portion L2-$a$ of the second signal lines L2 and a width D2 occupied by the second portion L2-$b$ of the second signal lines L2 can be adjusted based on actual requirements. For instance, the width D1 and the width D2 can be approximately 100 um in total, which should not be construed as a limitation to the invention.

In this embodiment, each of the pixel array units U has six OLED pixels 110, for instance, and the six OLED pixels 110 are connected to the same first signal line L1 (i.e., the scan line SL). Besides, the first portion L2-$a$ and the second portion L2-$b$ respectively include three of the second signal lines L2. Three of the six OLED pixels 110 are connected to the first portion L2-$a$ that contains three of the second signal lines L2 (i.e., the data lines DL), and the other three of the six OLED pixels 110 are connected to the second portion L2-$b$ that contains other three of the second signal lines L2 (i.e., the data lines DL).

The six OLED pixels 110 can be substantially divided into two groups, and each group has three of the OLED pixels 110, for instance. The two groups of OLED pixels 110 are respectively connected to the first portion L2-$a$ and the second portion L2-$b$ located at two opposite sides and can be substantially arranged in a mirror-symmetrical manner with respect to a reference line RL. However, in other embodiments of the invention, the two groups of OLED pixels 110 can respectively contain two and four of the OLED pixels 110, one and five of the OLED pixels 110, four and two of the OLED pixels 110, or five and one of the OLED pixels 110.

In brief, each of the pixel array units U can include n OLED pixels 110, and n is an integer greater than or equal to two. The n OLED pixels 110 in each of the pixel array units U are connected to the same first signal line L1 (i.e., the scan line SL of this embodiment). Meanwhile, x OLED pixels 110 of the n OLED pixels 110 are connected to the first portion L2-$a$ that contains x second signal lines L2 (i.e., the data lines DL), and (n−x) OLED pixels 110 are connected to the second portion L2-$b$ that contains (n−x) second signal lines L2 (i.e., the data lines DL). Here, x is an integer greater than 1 and less than n, or x is equal to 1.

Each of the OLED pixels 110 of this embodiment can include a switch device TS, a driving device TD, and an OLED unit LD. The switch device TS is electrically connected to the driving device TD, a corresponding one of the first signal lines L1, and a corresponding one of the second signal lines L2, and the driving device TD is connected to a corresponding one of the power lines PL and the OLED unit LD. Specifically, the switch device TS can include a source S, a drain D, and a gate G; the driving device TD can also include a source S', a drain D', and a gate G'. The drain D of the switch device TS is electrically connected to the gate G' of the driving device TD, the source S of the switch device TS is electrically connected to the corresponding one of the second signal lines L2 (i.e., the data lines DL), and the gate G of the switch device TS is electrically connected to the corresponding one of the first signal lines L1 (i.e., the scan lines SL). The source S' of the driving device TD is electrically connected to the corresponding one of the power lines PL, and the drain D' of the driving device TD is electrically connected to the corresponding OLED unit LD. Here, the source S of the switch device TS is electrically connected to the corresponding one of the second signal lines L2 (i.e., the data lines DL) through one of the connection lines CL, for instance.

The film layer where the OLED units LD are formed is different from the film layer where the first signal lines L1 and the second signal lines L2 are formed. When the OLED unit LD of each of the OLED pixels 110 is a top emissive OLED unit, the first and second signal lines L1 and L2 can be configured below the OLED unit LD and partially covered by the OLED unit LD. The first portion L2-a and the second portion L2-b of the second signal lines L2 are respectively overlapped with a part of the OLED pixels 110 in each of the pixel array units U. Hence, the region where the first portion L2-a and the second portion L2-b are configured can serve as a display region, and the width W of the transmittance region R can be less than the total width of the OLED pixels 110 in one pixel array unit U. However, if the first portion L2-a and the second portion L2-b of the second signal lines L2 are not overlapped with the OLED units LD, the width W of the transmittance region R can be greater than the total width of the OLED pixels 110 in one pixel array unit U. As a whole, whether the OLED units LD are overlapped with the first signal lines L1 and the second signal lines L2 or not can be determined based on the required width W of the transmittance regions R and the required display effects.

Second Embodiment

Figure 2:
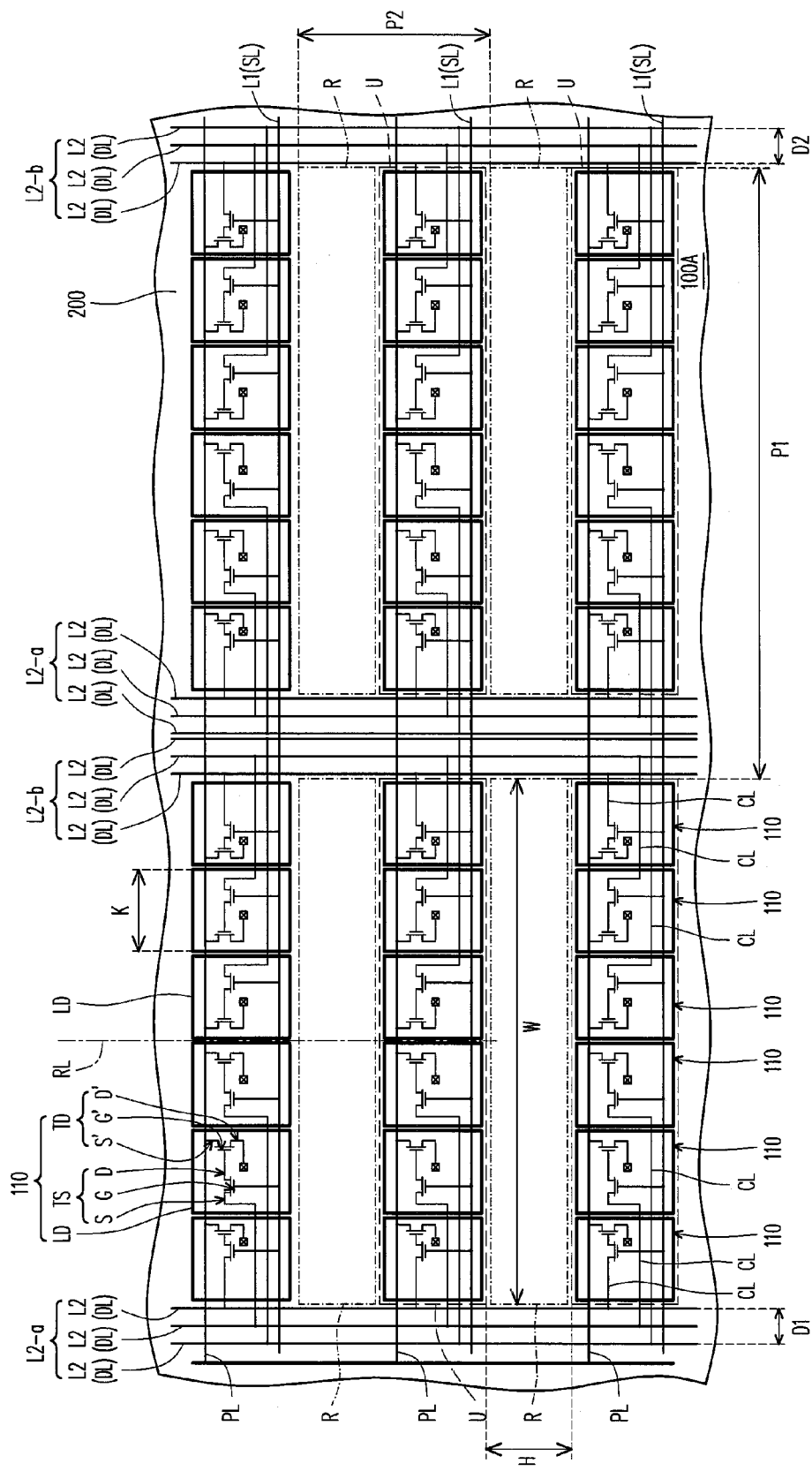
FIG. 2 is a schematic view illustrating an OLED pixel array according to a second embodiment of the invention.

FIG. 2 is a schematic view illustrating an OLED pixel array 100A according to a second embodiment of the invention. With reference to FIG. 2, the OLED pixel array 100A of this embodiment is similar to the OLED pixel array 100 of the first embodiment as shown in FIG. 1, and therefore the same elements in FIG. 2 and FIG. 1 are represented by the same reference numerals or symbols. The difference therebetween is described below, while the similarity therebetween is omitted herein.

In the OLED pixel array 100A of this embodiment, the OLED pixels 110 are located between the first portion L2-a and the second portion L2-b of the second signal lines L2. Here, a transmittance region R is surrounded by the first portion L2-a, the second portion L2-b, and the OLED pixels 110, and the first portion L2-a and the second portion L2-b are respectively located at two opposite sides of the transmittance region R. Specifically, the difference between the OLED pixel array 100A of this embodiment and the OLED pixel array 100 of the first embodiment lies in that the first portion L2-a and the second portion L2-b of the second signal lines L2 are located at two opposite sides of each of the pixel array units U, and the first portion L2-a and the second portion L2-b of the second signal lines L2 are not overlapped with the OLED pixels 110 in each of the pixel array units U according to this embodiment.

Thereby, in this embodiment, the transmittance region R surrounded by each of the pixel array units U has a width W in the extension direction of the first signal lines L1, and each of the OLED pixels 110 has a width K in the extension direction of the first signal lines L1. The width W can be at least twice the width K. In this embodiment, each of the pixel array units U has six OLED pixels 110, and the transmittance region R surrounded by each of the pixel array units U has the width W in the extension direction of the first signal lines L1 (i.e., the scan lines SL). Each of the OLED pixels 110 has the width K in the extension direction of the first signal lines L1. The width W is at least six times the width K.

Third Embodiment

Figure 3:
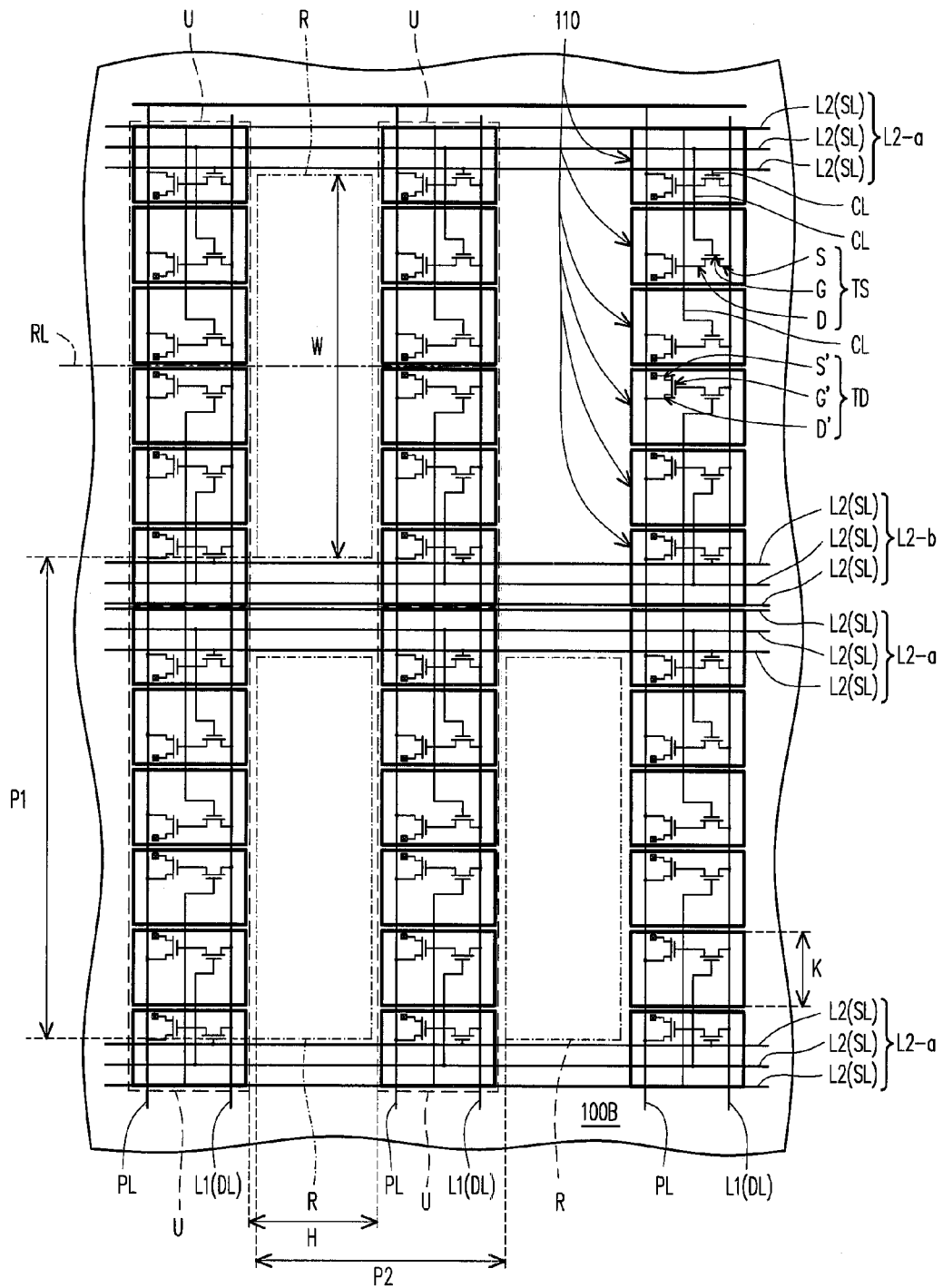
FIG. 3 is a schematic view illustrating an OLED pixel array according to a third embodiment of the invention.

FIG. 3 is a schematic view illustrating an OLED pixel array 100B according to a third embodiment of the invention. With reference to FIG. 3, the OLED pixel array 100B of this embodiment is similar to the OLED pixel array 100 of the first embodiment as shown in FIG. 1, and therefore the same elements in FIG. 3 and FIG. 1 are represented by the same reference numerals or symbols. The difference therebetween is described below, while the similarity therebetween is omitted herein.

The difference between the OLED pixel array 100B of this embodiment and the OLED pixel array 100 of the first embodiment lies in that the first signal lines L1 are the data lines DL, and the second signal lines L2 are the scan lines SL. Since the OLED pixel array 100B of this embodiment is similar to the OLED pixel array 100 of the first embodiment except for the above-mentioned difference, no further description is given herein. That is to say, in each of the OLED pixels 110, the gate G of the switch device TS is electrically connected to the corresponding one of the second signal lines L2 (i.e. the scan lines SL) through one of the connection lines CL. Besides, the same pixel array unit U is connected to the same first signal line L1 (i.e., the data line DL).

Fourth Embodiment

Figure 4:
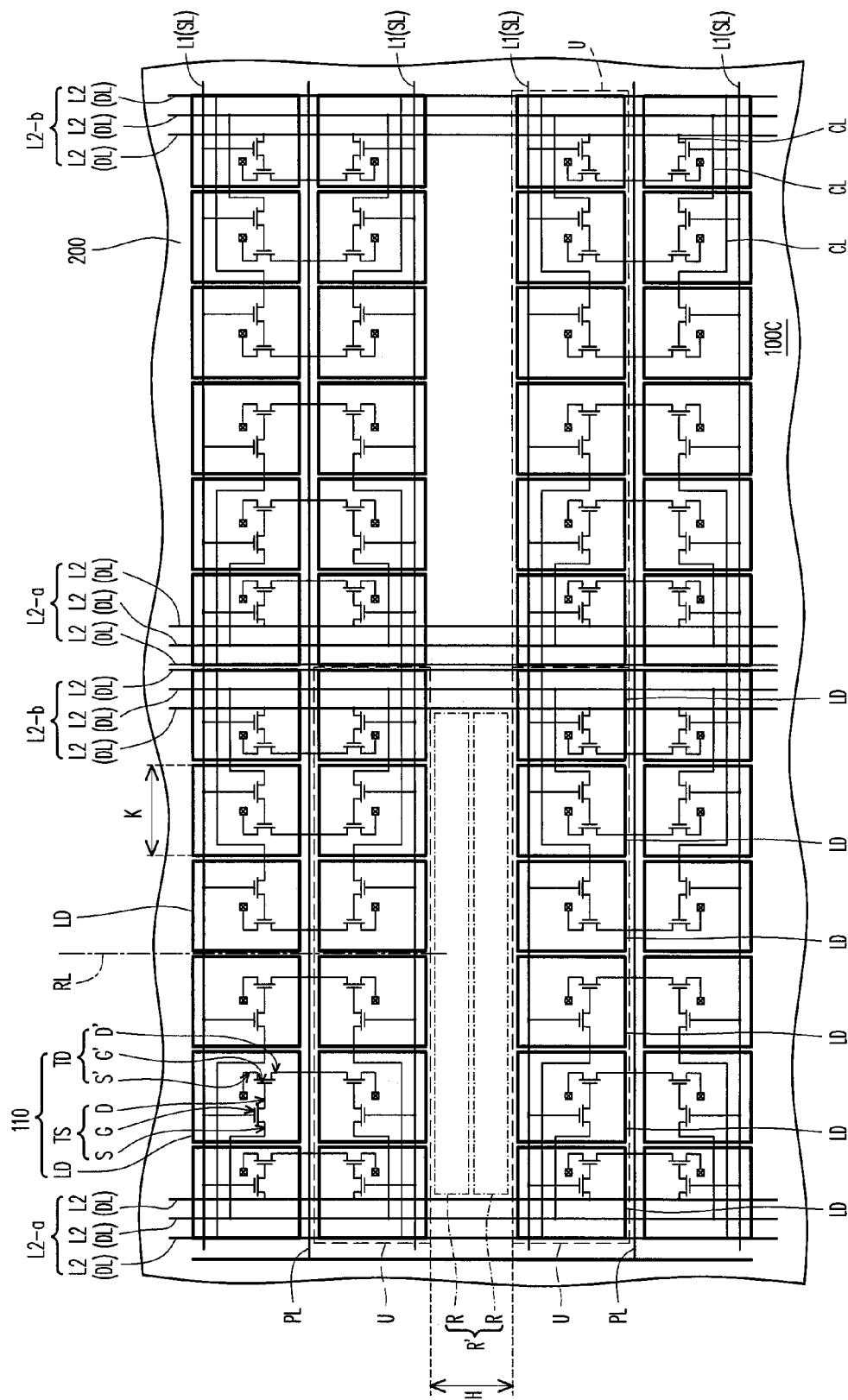
FIG. 4 is a schematic view illustrating an OLED pixel array according to a fourth embodiment of the invention.

FIG. 4 is a schematic view illustrating an OLED pixel array 100C according to a fourth embodiment of the invention. With reference to FIG. 4, the OLED pixel array 100C of this embodiment is similar to the OLED pixel array 100 of the first embodiment as shown in FIG. 1, and therefore the same elements in FIG. 4 and FIG. 1 are represented by the same reference numerals or symbols. The difference therebetween is described below, while the similarity therebetween is omitted herein.

The difference between the OLED pixel array 100C of this embodiment and the OLED pixel array 100 of the first embodiment lies in that the transmittance regions R surrounded by the adjacent pixel array units U are connected in this embodiment. That is to say, according to this embodiment, since the transmittance regions R surrounded by the adjacent pixel array units U are connected, the entire area of the transmittance region R' is greater than the area of the transmittance region R of the first embodiment. Hence, when the transparent OLED display formed by the OLED pixel array 100C is placed in front of another display, the external images observed through the OLED pixel array 100C can have a rather satisfactory imaging quality.

In addition, the power lines PL of this embodiment are parallel to the first signal lines L1 (i.e., the scan lines SL). Namely, the adjacent two pixel array units U located at the respective sides of the corresponding one of the power lines PL are mirror-symmetrical to each other with respect to the corresponding power line PL. Certainly, the entire area of the transmittance region R' of this embodiment is not limited to be twice the area of the transmittance region R of the first embodiment. The entire area of the transmittance region R' can be adjusted based on the requirements for light transmittance and display quality, which should not be construed as limitations to the invention.

Fifth Embodiment

Figure 5:
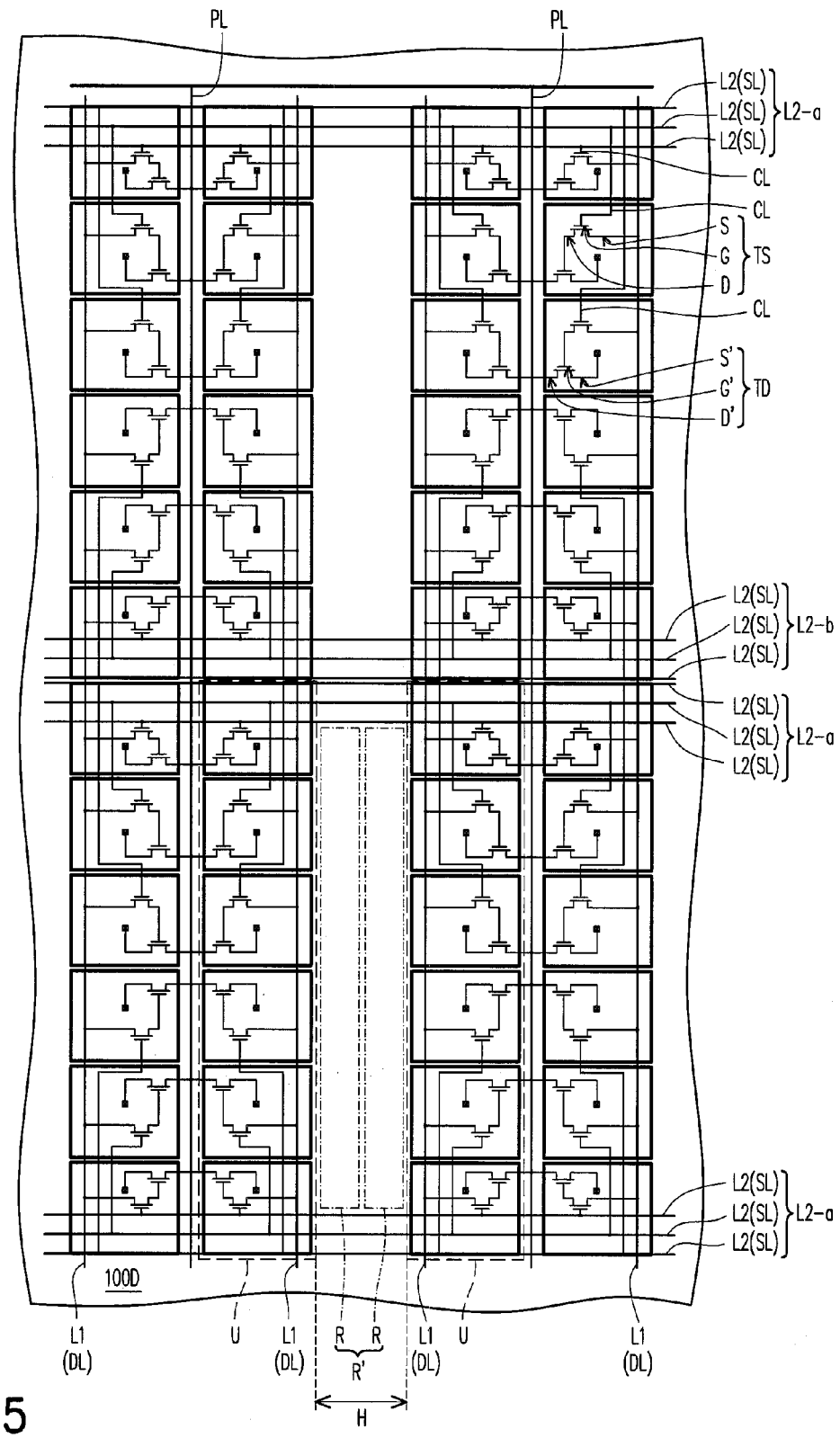
FIG. 5 is a schematic view illustrating an OLED pixel array according to a fifth embodiment of the invention.

FIG. 5 is a schematic view illustrating an OLED pixel array 100D according to a fifth embodiment of the invention. With reference to FIG. 5, the OLED pixel array 100D of this embodiment is similar to the OLED pixel array 100C of the fourth embodiment as shown in FIG. 4, and therefore the same elements in FIG. 5 and FIG. 4 are represented by the same reference numerals or symbols. The difference therebetween is described below, while the similarity therebetween is omitted herein.

The difference between the OLED pixel array 100D of this embodiment and the OLED pixel array 100C of the fourth embodiment lies in that the first signal lines L1 of this embodiment are the data lines DL, and the second signal lines L2 of this embodiment are the scan lines SL. That is to say, in each of the OLED pixels 110, the gate G of the switch device TS is electrically connected to the corresponding one of the second signal lines L2 (i.e. the scan lines SL) through one of the connection lines CL. Besides, the same pixel array unit U is connected to the same first signal line L1 (i.e., the data line DL). Two transmittance regions R surrounded by the adjacent pixel array units U are also connected to each other in this embodiment. The adjacent two pixel array units U can be connected to the same power line PL and are located at two opposite sides of the corresponding power line PL.

In view of the foregoing, each of the pixel array units in the OLED pixel array of this invention at least has two OLED pixels, and the first portion and the second portion of the second signal lines are arranged at two opposite sides of the pixel array units. Meanwhile, a transmittance region is surrounded by the pixel array units and the first and second portions of the second signal lines in this invention. The width of the transmittance region in the extension direction of the first signal lines (or the second signal lines) can be increased based on different requirements. Thereby, the spatial frequency of the transmittance regions with the relatively large area can be significantly reduced. Consequently, when the transparent OLED display formed by the OLED pixel array is placed in front of another display, the external images observed through the OLED pixel array can have a rather satisfactory imaging quality.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An organic light emitting diode pixel array configured on a substrate and comprising:
    a plurality of first signal lines;
    a plurality of second signal lines intersecting the first signal lines, wherein when the first signal lines are scan lines, the second signal lines are data lines, and when the first signal lines are the data lines, the second signal lines are the scan lines; and
    a plurality of pixel array units arranged in array on the substrate, each of the pixel array units comprising:
        a plurality of organic light emitting diode pixels connected to one of the first signal lines and respectively connected to a first portion and a second portion of the second signal lines, at least two of the organic light emitting diode pixels being located between the first portion and the second portion, wherein a transmittance region is surrounded by the first portion, the second portion, and the organic light emitting diode pixels, the first portion and the second portion are respectively located at two opposite sides of the transmittance region, and the first portion and the second portion are respectively located at two opposite sides of the pixel array units so that the transmittance region is continuous between the first portion and the second portion of the second signal lines without being penetrated by the second signal lines or the first signal lines, and a minimum distance between the first portion and the second portion is at least greater than a pitch of any two adjacent organic light emitting diode pixels in an extension direction of the first signal lines.

2. The organic light emitting diode pixel array as claimed in claim 1, wherein the transmittance region surrounded by each of the pixel array units has a width in the extension direction of the first signal lines, and the width is at least greater than a width of one of the organic light emitting diode pixels in the extension direction.

3. The organic light emitting diode pixel array as claimed in claim 1, wherein the transmittance regions surrounded by adjacent pixel array units of the pixel array units are connected.

4. The organic light emitting diode pixel array as claimed in claim 1, wherein the first signal lines and the second signal lines are located between the organic light emitting diode pixels and the substrate.

5. The organic light emitting diode pixel array as claimed in claim 1, wherein each of the pixel array units further comprises a plurality of connection lines correspondingly connecting the organic light emitting diode pixels to the first portion and the second portion of the second signal lines.

6. The organic light emitting diode pixel array as claimed in claim 1, further comprising a plurality of power lines parallel to the first signal lines or the second signal lines, the power lines being electrically connected to the organic light emitting diode pixels.

7. The organic light emitting diode pixel array as claimed in claim 6, wherein the power lines are electrically connected to one another.

8. The organic light emitting diode pixel array as claimed in claim 6, wherein each of the organic light emitting diode pixels comprises a switch device, a driving device, and a light emitting diode unit, the switch device is electrically connected to the driving device, a corresponding one of the first signal lines, and a corresponding one of the second signal lines, and the driving device is connected to a corresponding one of the power lines and the light emitting diode unit.

9. The organic light emitting diode pixel array as claimed in claim 8, wherein the light emitting diode unit of each of the organic light emitting diode pixels is a top emissive light emitting diode unit.

* * * * *